US007548433B2

(12) United States Patent
Rispoli et al.

(10) Patent No.: US 7,548,433 B2
(45) Date of Patent: Jun. 16, 2009

(54) APPARATUS AND METHOD FOR SETTING ADEQUATE DRIVE STRENGTH BASED UPON DC TRACE RESISTANCE

(75) Inventors: Joseph Rispoli, Round Rock, TX (US); Aaron Carpenter, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 798 days.

(21) Appl. No.: 11/127,446

(22) Filed: May 12, 2005

(65) Prior Publication Data
US 2006/0255813 A1    Nov. 16, 2006

(51) Int. Cl.
*H01R 9/00* (2006.01)
(52) U.S. Cl. ........................ 361/775; 361/748; 361/760; 29/592.1; 29/593
(58) Field of Classification Search ................. 361/775, 361/748, 760; 29/592.1, 593
See application file for complete search history.

(56) References Cited

U.S. PATENT DOCUMENTS

| | | | |
|---|---|---|---|
| 6,430,606 B1 * | 8/2002 | Haq | 709/208 |
| 6,496,037 B1 * | 12/2002 | Bertin et al. | 326/82 |
| 7,177,610 B2 * | 2/2007 | Scott et al. | 455/259 |
| 7,205,787 B1 * | 4/2007 | Massoumi et al. | 326/30 |
| 7,336,212 B2 * | 2/2008 | Fung et al. | 341/164 |
| 2002/0050844 A1 * | 5/2002 | Lau et al. | 327/108 |

* cited by examiner

Primary Examiner—Jeremy C Norris
Assistant Examiner—Xiaoliang Chen
(74) Attorney, Agent, or Firm—Baker Botts L.L.P.

(57) ABSTRACT

An information handing system having apparatus for setting adequate drive strength based upon direct current (DC) trace resistance uses a resistance detection traces for each signal layer of a printed circuit board. These resistance detection traces are coupled to pull-up resistors and routed with a length and cross-sectional geometry that is substantially equal to the worst case routing of a net on a bus that is to be free of receiver mask violations (inadequate received signal strengths). Reference voltage levels may be determined for each bus so as to be representative of the minimum voltage acceptable to guarantee that the worst-case DC trace resistance will not cause the bus waveforms to fail signal integrity. A voltage comparator circuit may be used to compare the determined reference voltage levels with the voltage levels of the resistance detection traces of each of the printed circuit board layers. When the voltage comparator determines that a resistance detection trace voltage is too low, an output from the voltage comparator may be used to generate an error message to a general purpose input-output (GPIO) that may initiate programming (e.g., change the flash memory) of a bus controller so as to use the next higher drive strength setting.

27 Claims, 3 Drawing Sheets

APPARATUS AND METHOD FOR SETTING ADEQUATE DRIVE STRENGTH BASED UPON DC TRACE RESISTANCE

TECHNICAL FIELD

The present invention relates generally to information handling systems and, more particularly, to setting adequate drive strength based upon direct current (DC) trace resistance in the information handling system.

BACKGROUND

As the value and use of information continues to increase, individuals and businesses seek additional ways to process and store information. One option available to users are information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems, e.g., computer, personal computer workstation, portable computer, computer server, print server, network router, network hub, network switch, storage area network disk array, RAID disk system and telecommunications switch.

In the information handling systems, printed circuit board subassemblies have signal buses comprising a plurality of conductive traces formed on the printed circuit board insulated substrate. Integrated circuit bus controllers drive data signals over these plurality of conductive traces with very little margin over a minimum specified receiver input level, e.g., specified receiver mask requirements. Printed circuit boards have a wide variation in conductive trace characteristics depending upon board design, materials and processes used, manufacturing tolerances, etc. This is especially prevalent in variations of the conductive trace cross-sectional geometries. Since the DC resistance of the conductive traces are proportional to the cross-sectional geometry, trace resistance may vary even from the same manufacture using the board design. Where the printed circuit board subassembly is operating under very little signal voltage margin, an increase of as little as one ohm of DC trace resistance may make the difference between an acceptable received signal level or a receiver signal mask violation.

Printed circuit board signal handling specifications have focused on trace impedance rather than variations in trace resistance. For example, Intel's Hub Interface (HI) specifies an RCOMP resistor for impedance compensation. RCOMP has a tolerance of one percent or better and is used to set a reference resistance against which the on-die bus driver termination compensates. The value of the RCOMP resistor may change depending upon the characteristic impedance of the data bus. For example, HI 2.0 specifies a 62.5 ohm resistor for a 50 ohm characteristic bus impedance, and a 75 ohm resistor for a 60 ohm characteristic bus impedance. However, variations of the trace resistance among printed circuit boards, even of the same design, are not taken into account. True impedance of the traces on the printed circuit board are dismissed as a minor variance. A well used solution to higher signal loss (higher resistance) traces has been to increase signal drive strength for all bus signals. This results, however, in increased power draw and heat dissipation. It may also increase cross-talk interference between the signal traces.

Another solution in avoiding higher then desired DC trace resistance-caused problems is to increase the cross sectional area of the traces, e.g., widen and/or thicken (increase height of) the traces. This may increase the cost of printed circuit board layers and ultimately the cost of the printed circuit board assembly. Another possible but costly solution is to require the printed circuit board manufacturers to measure DC trace resistance for each printed circuit board, similar to the inspection process used for high end impedance-controlled printed circuit boards that require measurement of trace impedance. Requiring this type of inspection may reduce the number of printed circuit boards that pass and thus will ultimately increase the cost of these printed circuit boards.

None of the aforementioned solutions would successfully address another problem where data buses pass through integrated circuits, e.g., exchange switches, having a wide variation of resistances in the signal paths.

SUMMARY

An apparatus and method is used for automatically detecting when the drive strength setting is too low for a printed circuit board bus trace configuration and for sending appropriate information so that drive strength may be set to a proper level for the printed circuit board bus trace configuration.

According to a specific example embodiment of this disclosure, "resistance detection" traces may be added on each signal layer of a printed circuit board. These resistance detection traces are coupled to pull-up resistors and routed with a length and cross-sectional geometry that is substantially equal to the worst case routing of a net on a bus that is to be free of receiver mask violations (inadequate received signal strengths). Reference voltage levels may be determined for each bus so as to be representative of the minimum voltage acceptable to guarantee that the worst-case DC trace resistance will not cause the bus waveforms to fail signal integrity. A voltage comparator circuit may be used to compare the determined reference voltage levels with the voltage levels of the resistance detection traces of each of the printed circuit board layers. When the voltage comparator determines that a resistance detection trace voltage is too low, an output from the voltage comparator may be used to generate an error message that may be routed, for example but not limited to, a general purpose input-output (GPIO) that may be used to initiate programming (e.g., change the flash memory) of a bus controller so as to use the next higher drive strength setting. To minimize power usage, a signal output driving the resistance detection traces may be of short and/or infrequent time duration. The voltage comparator output may be ANDed with the test pulse signal for generating the error message. This apparatus and method may also be used to compensate for low power supply voltages on the driver devices. A stable voltage reference, e.g., band-gap voltage reference and the like, may be used for generating the determined reference voltage levels.

The apparatus and method of the specific example embodiment of this disclosure allows use of printed boards with higher then desired DC trace resistance to properly function within signal specifications, while preventing excessive drive strength to be applied to the printed circuit boards having better performance characteristics, e.g., lower trace resistance. This apparatus and method of the specific example embodiment may be utilized with any data bus, e.g., serial or parallel, including, but not limited to, Universal Serial Bus (USB), small computer system interface (SCSI), serial-attached SCSI (SAS), etc.

BRIEF DESCRIPTION OF THE DRAWINGS

A more complete understanding of the present disclosure and advantages thereof may be acquired by referring to the following description taken in conjunction with the accompanying drawings wherein.

Figure 1:
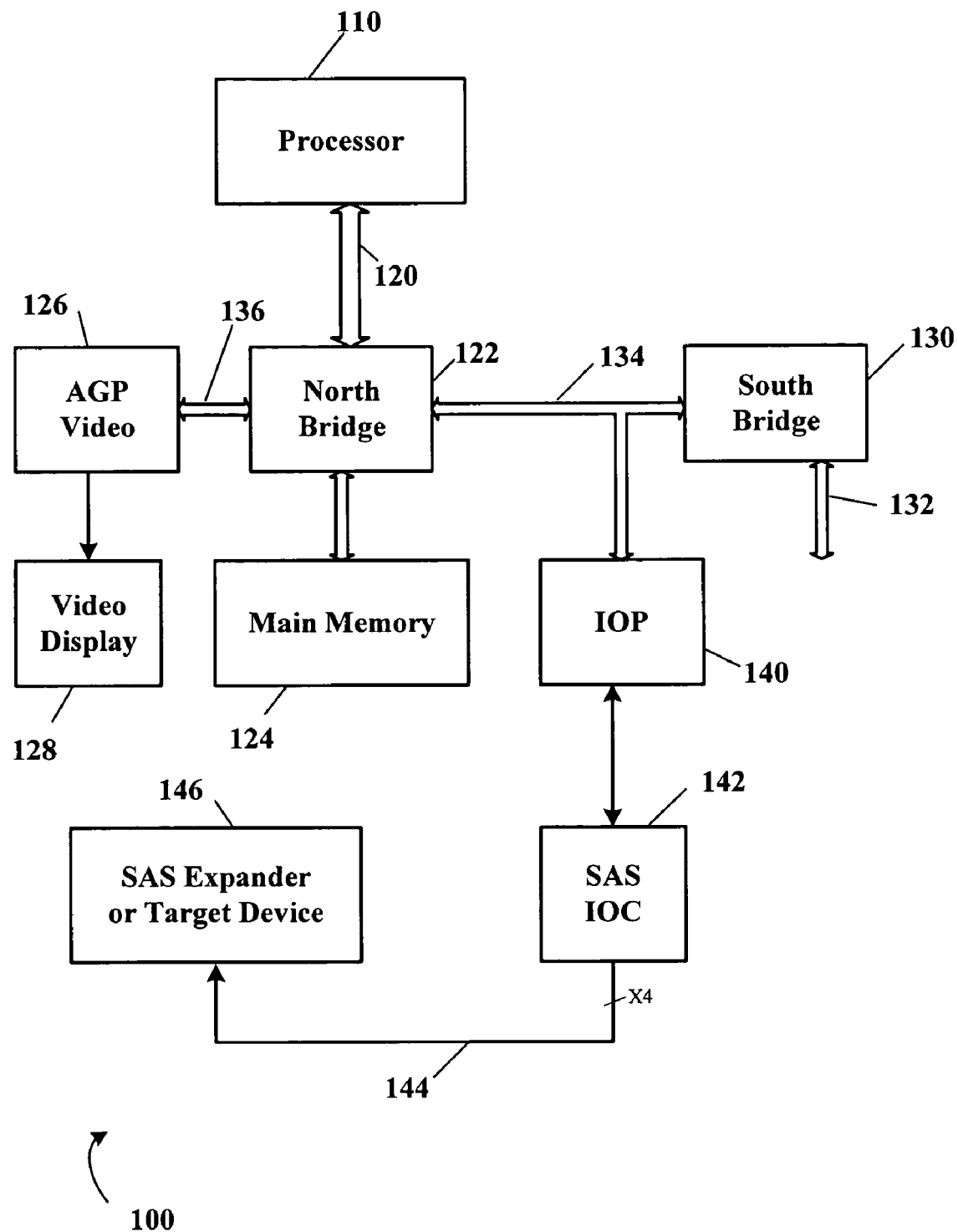
FIG. 1 is a schematic block diagram of an information handling system, according to a specific example embodiment of the present disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU), hardware or software control logic, read only memory (ROM), and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring now to the drawings, the details of specific example embodiments of the present invention are schematically illustrated. Like elements in the drawings will be represented by like numbers, and similar elements will be represented by like numbers with a different lower case letter suffix.

Referring to FIG. 1, depicted is an information handling system having electronic components mounted on at least one printed circuit board (PCB) (motherboard) and communicating data and control signals therebetween over signal buses, according to a specific example embodiment of the present disclosure. In one example embodiment, the information handling system is a computer system. The information handling system, generally referenced by the numeral 100, comprises at least one processor 110 coupled to a host bus(es) 120. A north bridge 122, which may also be referred to as a memory controller hub or a memory controller, is coupled to a main system memory 124. The north bridge 122 is coupled to the at least one system processor 110 via the host bus(es) 120. The north bridge 122 is generally considered an application specific chip set that provides connectivity to various buses, and integrates other system functions such as a memory interface. For example, an Intel 820E and/or 815E chip set, available from the Intel Corporation of Santa Clara, Calif., provides at least a portion of the north bridge 122. The chip set may also be packaged as an application specific integrated circuit (ASIC). The north bridge 122 typically includes functionality to couple the main system memory 124 to other devices within the information handling system 100. Thus, memory controller functions such as main memory control functions typically reside in the north bridge 122. In addition, the north bridge 122 provides bus control to handle transfers between the host bus 120 and a second bus(es), e.g., PCI bus 134, AGP bus 136 coupled to a video graphics interface 126 which drives a video display 128. A third bus(es) 132 may also comprise other industry standard buses or proprietary buses, e.g., ISA, SCSI, $I^2C$, SPI, USB buses through a south bridge(s) (bus interface) 130. An input-output processor (IOP) 140 of a SAS adapter is coupled to the north bridge 122. A SAS input-output controller (IOC) 142 is coupled to the IOP 140. The IOC 142 is adapted for coupling to an SAS expander or target device 146 through, for example, a plurality of SAS physical links 144. The internal buses 134, 136, 132 have certain trace resistances dependent upon the characteristics of the printed circuit board(s) comprising the information handling system 100. The SAS physical links 144 resistance may also be dependent upon the connectors and/or cable lengths therebetween.

Figure 2:
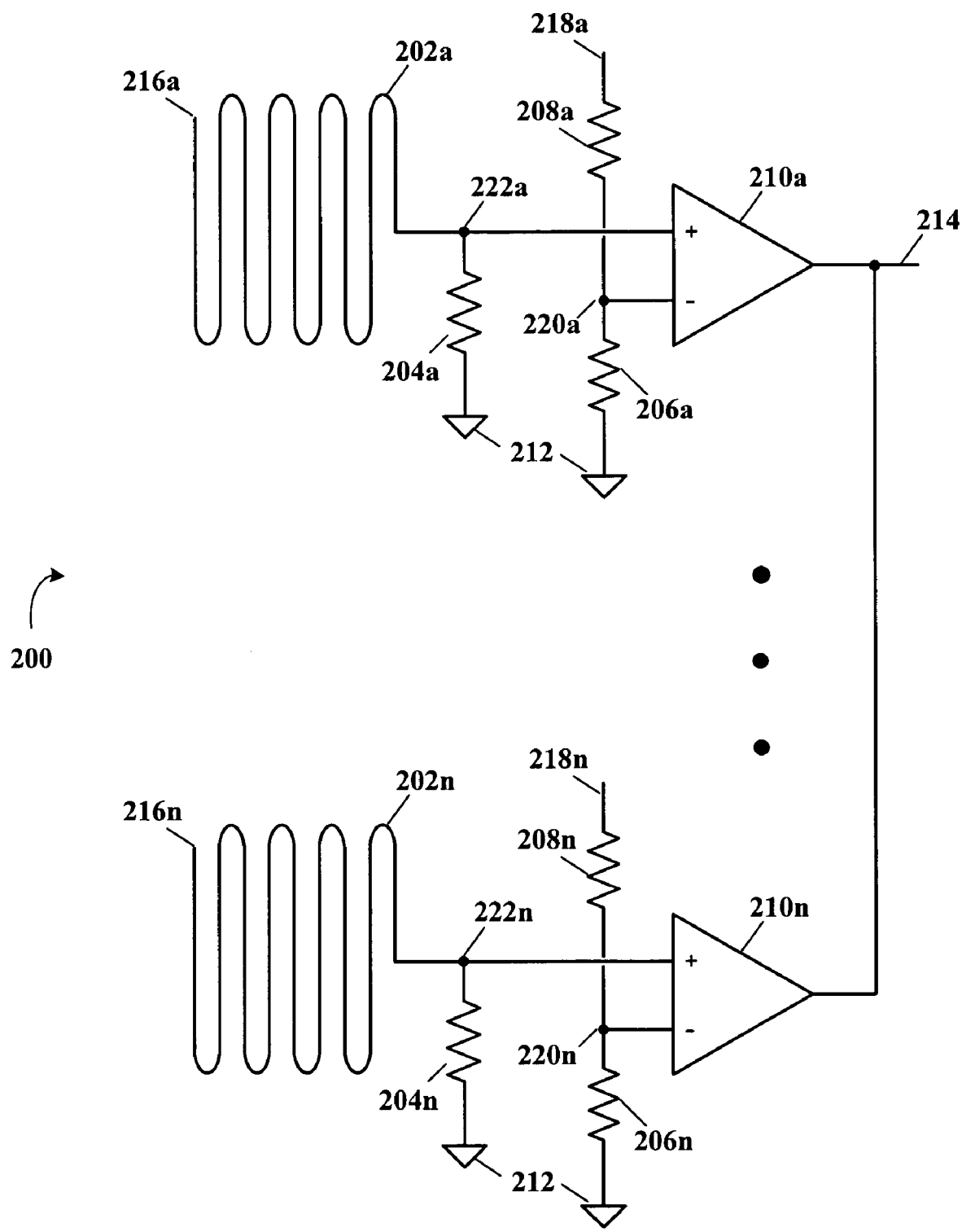
FIG. 2 is a schematic diagram of a drive strength detection circuit, according to a specific example embodiment of the present disclosure.

Referring now to FIG. 2, depicted is a schematic diagram of a drive strength detection circuit, according to a specific example embodiment of the present disclosure. The drive strength detection circuit, generally represented by the numeral 200, may comprise for each signal layer (e.g., 1 to n signal layers) of a printed circuit board (not shown) a resistance detection trace 202, a trace termination resistor 204, voltage divider resistors 206 and 208, and a voltage comparator 210. An input end of the resistance detection trace 202 may be coupled to a test voltage 216 from either a voltage source or an output of a bus driver at a logic high (not shown). The trace termination resistor 204 may be, for example but not limited to, a resistance value selected to match a characteristic impedance of the resistance detection trace 202. One end of the resistor 208 may be coupled to a reference voltage source 218 (not shown). The common or ground ends of the resistors 204 and 206 may be connected to a printed circuit board common (ground) node 212.

The voltage divider resistors 206 and 208 may be selected to produce a minimum drive strength reference voltage 220 on the negative input of the comparator 210. The actual (worst case) drive strength voltage 222 may be coupled to the positive input of the comparator 210. If the actual drive strength voltage 222 is greater then the minimum drive strength reference voltage 220, then the output of the comparator 210 will be at a logic high. If the actual drive strength voltage 222 is less than or equal to the minimum drive strength reference voltage 220, then the output 214 of the comparator 210 will be at a logic low. A logic low from the output 214 of the comparator 210 indicates that it would be advantageous if the drive strength is increased so as to better insure acceptable received signal levels at a bus receiver input (not shown).

The output 214 from the voltage comparator 210 may be used to generate an error message that may be routed, for example but not limited to, a general purpose input-output (GPIO) (not shown) that may be used to initiate programming (e.g., change the flash memory) of a bus controller (not shown) so as to use the next higher drive strength setting for the bus drivers.

Figure 3:
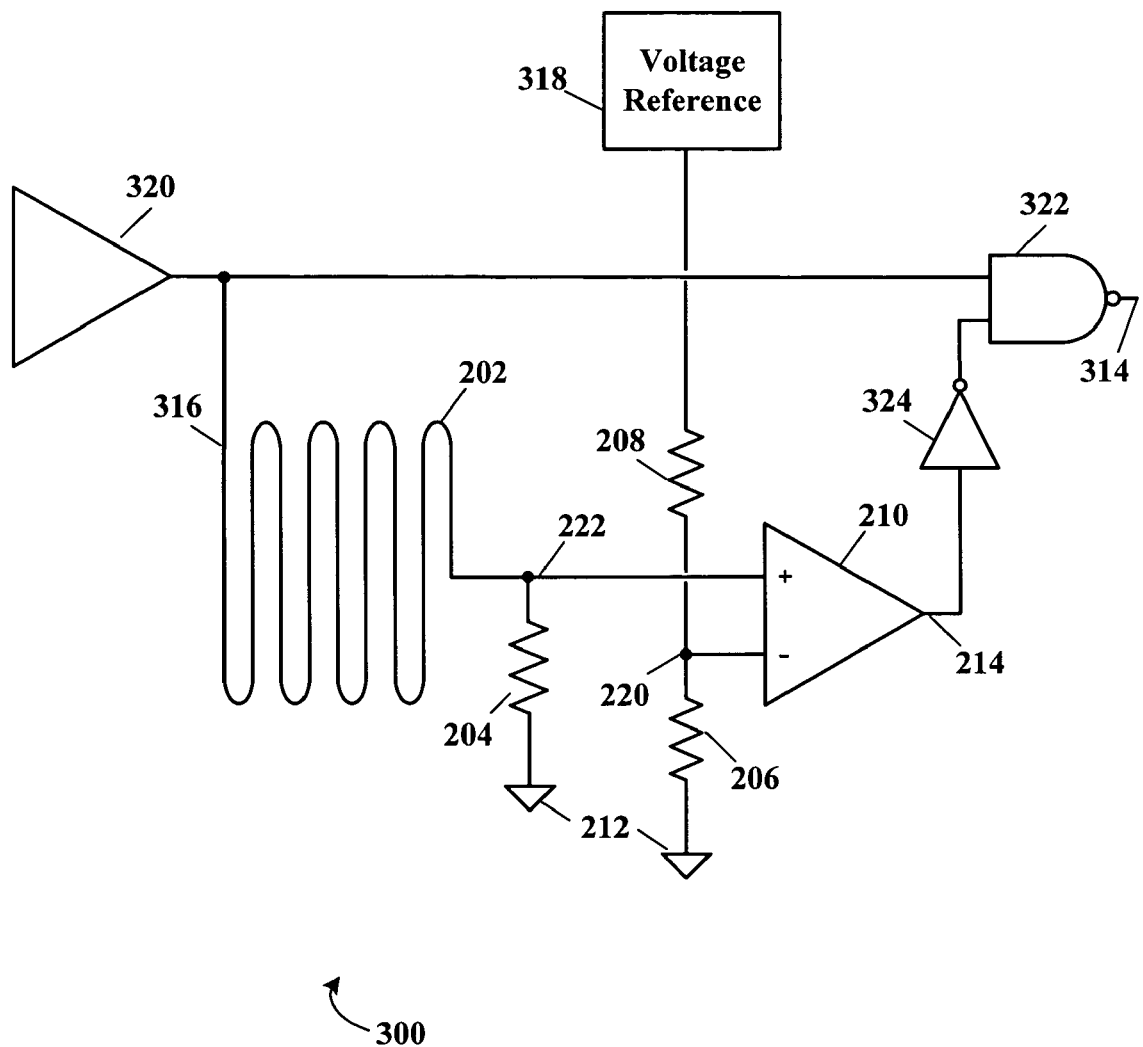
FIG. 3 is a schematic diagram of a drive strength detection circuit, according to another specific example embodiment of the present disclosure.

Referring now to FIG. 3, depicted is a schematic diagram of a drive strength detection circuit, according to another specific example embodiment of the present disclosure. The drive strength detection circuit, generally represented by the numeral 300, may comprise for each signal layer (e.g., 1 to n signal layers)(only one layer shown) of a printed circuit board (not shown) a resistance detection trace 202, a trace termination resistor 204, voltage divider resistors 206 and 208, and a voltage comparator 210. An input end 316 of the resistance detection trace 202 may be coupled to an output of a bus driver 320 at a logic high. The trace termination resistor 204 may be, for example but not limited to, a resistance value selected to match a characteristic impedance of the resistance detection trace 202. One end of the resistor 208 may be coupled to a reference voltage source 318, e.g., band-gap reference, so that this reference is substantially independent of power supply variations. The common or ground ends of the resistors 204 and 206 may be connected to a printed circuit board common (ground) node 212.

The voltage divider resistors 206 and 208 may be selected to produce a minimum drive strength reference voltage 220 on the negative input of the comparator 210. The actual (worst case) drive strength voltage 222 may be coupled to the positive input of the comparator 210. If the actual drive strength voltage 222 is greater then the minimum drive strength reference voltage 220, then the output of the comparator 210 will be at a logic high. If the actual drive strength voltage 222 is less than or equal to the minimum drive strength reference voltage 220, then the output 214 of the comparator 210 will be at a logic low. A logic low from the output 214 of the comparator 210 indicates that it would be advantageous if the drive strength is increased so as to better insure acceptable received signal levels at a bus receiver input (not shown).

To reduce power consumption, the bus driver 320 may have a pulsed output that is coupled to both the input 316 of the resistance detection trace 202 and an input of a NAND gate 322. Whereby if the actual drive strength voltage 222 (at a logic high from the driver 320) is greater then the minimum drive strength reference voltage 220, then the output 314 of the NAND gate 322 remain at a logic high (the inverter 324 maintains a logic low at the other input of the NAND gate 322). If the actual drive strength voltage 222 is less than or equal to the minimum drive strength reference voltage 220, then the output 314 of the NAND gate 322 will go to a logic low. Whenever the output 314 of the NAND gate 322 is at a logic low, an error message may be generated and routed, for example but not limited to, a general purpose input-output (GPIO) (not shown) that may be used to initiate programming (e.g., change the flash memory) of a bus controller (not shown) so as to use the next higher drive strength setting for the bus drivers.

The aforementioned example embodiments enable use of printed boards with higher then desired DC trace resistance to properly function within signal specifications, while preventing excessive drive strength to be applied to the printed circuit boards having better performance characteristics, e.g., lower trace resistance. This apparatus and method of the specific example embodiments may be utilized with any data bus, e.g., serial or parallel, including, but not limited to, Universal Serial Bus (USB), small computer system interface (SCSI), serial-attached SCSI (SAS), etc.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An information handing system having apparatus for setting adequate drive strength based upon direct current (DC) trace resistance, said system comprising:
    a printed circuit board, the printed circuit board having at least one layer of conductive signal traces;
    a resistance detection trace, wherein the resistance detection trace is configured to have characteristics substantially the same as a worst case signal trace of the at least one layer of conductive signal traces;
    a test voltage coupled to a first end of the resistance detection trace;
    a trace termination resistor coupled to a second end of the resistance detection trace;
    a voltage comparator having a first input coupled to the second end of the resistance detection trace and the trace termination resistor;
    a drive strength reference voltage coupled to a second input of the voltage comparator, wherein
        if a voltage at the second end of the resistance detection trace is greater than the drive strength reference voltage at the second input then the voltage comparator has an output at a first logic level, and
        if a voltage at the second end of the resistance detection trace is less than or equal to the drive strength reference voltage at the second input then the voltage comparator has an output at a second logic level.

2. The information handing system according to claim 1, wherein the characteristics of the resistance detection trace are length and cross-sectional area.

3. The information handing system according to claim 1, wherein the drive strength reference voltage is substantially equal to a minimum specified receiver input voltage level.

4. The information handing system according to claim 1, wherein the test voltage is from an output of a data driver.

5. The information handing system according to claim 4, wherein the output of the data driver is ANDed with the output of the voltage comparator.

6. The information handing system according to claim 1, wherein the trace termination resistor is approximately 62.5 ohms for approximately a 50 ohm characteristic bus trace impedance.

7. The information handing system according to claim 1, wherein the trace termination resistor is approximately 75 ohms for approximately a 60 ohm characteristic bus trace impedance.

8. The information handing system according to claim 1, wherein the drive strength reference voltage is derived from a reference voltage source.

9. The information handing system according to claim 8, wherein the reference voltage source is a band-gap reference voltage source.

10. The information handing system according to claim 1, wherein the output of the voltage comparator causes data driver drive strength to increase on the at least one layer of the conductive signal traces when the voltage comparator output is at the second logic level.

11. The information handing system according to claim 1, wherein the first logic level is a logic one and the second logic level is a logic zero.

12. The information handing system according to claim 1, wherein the first logic level is a logic zero and the second logic level is a logic one.

13. An information handing system having apparatus for setting adequate drive strength based upon direct current (DC) trace resistance, said system comprising:
 a printed circuit board, the printed circuit board having a plurality of conductive signal trace layers;
 a plurality of resistance detection traces, each of the plurality of resistance detection traces has a corresponding layer of the plurality of conductive signal trace layers, wherein each of the plurality of resistance detection traces is configured to have characteristics substantially the same as a worst case signal trace of the corresponding one of the plurality of conductive signal trace layers;
 a test voltage coupled to a first end of each of the plurality of resistance detection traces;
 a plurality of trace termination resistors having corresponding ones coupled to a second end of each of the plurality of resistance detection traces;
 a plurality of voltage comparators, each having a first input coupled to the second end of the corresponding one of the plurality of resistance detection traces and the corresponding one of the plurality of trace termination resistors;
 a drive strength reference voltage coupled to a second input of the plurality of voltage comparator, wherein,
  if a voltage at the second end of a one of the plurality of resistance detection traces is greater than the drive strength reference voltage at the second input then the corresponding one of the plurality of voltage comparators has an output at a first logic level, and
  if a voltage at the second end of the one of the plurality of resistance detection traces is less than or equal to the drive strength reference voltage at the second input then the corresponding one of the plurality of voltage comparators has an output at a second logic level.

14. The information handing system according to claim 13, wherein the characteristics of the resistance detection trace are length and cross-sectional area.

15. The information handing system according to claim 13, wherein the drive strength reference voltage is substantially equal to a minimum specified receiver input voltage level.

16. The information handing system according to claim 13, wherein the test voltage is from an output of a data driver.

17. The information handing system according to claim 13, wherein the trace termination resistor is approximately 62.5 ohms for approximately a 50 ohm characteristic bus trace impedance.

18. The information handing system according to claim 13, wherein the trace termination resistor is approximately 75 ohms for approximately a 60 ohm characteristic bus trace impedance.

19. The information handing system according to claim 13, wherein the drive strength reference voltage is derived from a reference voltage source.

20. The information handing system according to claim 19, wherein the reference voltage source is a band-gap reference voltage source.

21. The information handing system according to claim 13, wherein when the output of a one of the plurality of voltage comparators is at the second logic level a corresponding data driver drive strength is increased.

22. A method for setting adequate drive strength based upon direct current (DC) trace resistance, said method comprising the steps of:
 a) driving a resistance detection trace on a printed circuit board with a test voltage coupled to a first end of the resistance detection trace, wherein the resistance detection trace is configured to have characteristics substantially the same as a worst case signal trace on the printed circuit board; and
 b) comparing a voltage at a second end of the resistance detection trace with a drive strength reference voltage, wherein if the voltage at the second end of the resistance detection trace is less than or equal to the drive strength reference voltage then increase a data driver drive strength.

23. The method according to claim 22, wherein the step of driving the resistance detection trace is done with a data driver.

24. The method according to claim 22, wherein the step of comparing is done with a voltage comparator.

25. The method according to claim 22, wherein the second end of the resistance detection trace is terminated with a resistor selected for a characteristic impedance of the resistance detection trace.

26. The method according to claim 22, wherein the drive strength reference voltage is substantially equal to a minimum specified receiver input voltage level.

27. The method according to claim 22, wherein steps a) and b) are repeated for each layer of the printed circuit board having conductive signal traces.

* * * * *